United States Patent
Lee et al.

(10) Patent No.: US 7,282,414 B2
(45) Date of Patent: Oct. 16, 2007

(54) FABRICATION METHODS FOR COMPRESSIVE STRAINED-SILICON AND TRANSISTORS USING THE SAME

(75) Inventors: Min-Hung Lee, Taipei (TW); Cheng-Yeh Yu, Changhua (TW); Shing-Chii Lu, Hsinchu (TW); Chee-Wee Liu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 154 days.

(21) Appl. No.: 10/909,403

(22) Filed: Aug. 3, 2004

(65) Prior Publication Data
US 2005/0258460 A1   Nov. 24, 2005

(30) Foreign Application Priority Data
May 18, 2004   (TW) .................. 93113926 A

(51) Int. Cl.
*H01L 21/336*  (2006.01)

(52) U.S. Cl. .................. 438/286; 438/528; 438/938; 257/E21.618

(58) Field of Classification Search ............... 438/286, 438/290, 938; 257/E21.618
See application file for complete search history.

(56) References Cited

U.S. PATENT DOCUMENTS 6,228,694 B1 *   5/2001   Doyle et al. ................. 438/199
6,803,270 B2 *   10/2004   Dokumachi et al. ........ 438/231

* cited by examiner

*Primary Examiner*—Chandra Chaudhari
(74) *Attorney, Agent, or Firm*—Birch, Stewart, Kolasch & Birch, LLP

(57) ABSTRACT

Fabrication methods for compressive strained-silicon by ion implantation. Ions are implanted into a silicon-containing substrate and high temperature processing converts the vicinity of the ion-contained region into strained-silicon. Transistors fabricated by the method are also provided.

20 Claims, 8 Drawing Sheets

US 7,282,414 B2

FABRICATION METHODS FOR COMPRESSIVE STRAINED-SILICON AND TRANSISTORS USING THE SAME

This Non-provisional application claims priority under 35 U.S.C. § 119(a) on Patent Application No(s). 093113926 filed in Taiwan, Republic of China on May 18, 2004, the entire contents of which are hereby incorporated by reference.

BACKGROUND

The present invention relates to a fabrication method for strained-silicon and, in particular, to compressive strained-silicon.

Chip operating speeds, while desirable, depend on driving current. Improving mobility of the device to increase driving current thereof has become a technique commonly used by chip manufacturers.

In recent years, research has proven that strained-silicon enhances carrier mobility significantly. As shown in FIGS. 1A and 1B, electron mobility increases with tensile strain and hole mobility increases with compressive strain. Electron or hole mobility is higher in MOSFET with a channel of strained-silicon than a conventional MOSFET, of the same size, without strained-silicon. Increased performance is thus accomplished. A current method of fabricating strained-silicon forms the strained-silicon on a relaxed silicon-germanium layer. Since the lattice constant of germanium is 4% larger than that of silicon, the relaxed silicon-germanium layer exerts tensile stress on silicon during formation on the silicon-germanium layer, wherein the silicon-germanium layer is formed on a graded silicon-germanium layer.

Tensile strained-silicon has been realized through several methods such that performance of the NMOS device is enhanced. However, there is no effective method to fabricate the compressive strained-silicon required to improve hole mobility and driving current of a PMOS device, a barrier to application of the strained-silicon technology to integrated circuits.

SUMMARY

An embodiment of a fabrication method for compressive strained-silicon comprises providing a silicon-containing substrate, implanting ions therein and converting the vicinity of the ion-containing region to strained-silicon.

An embodiment of a MOSFET fabricated by a fabrication method of compressive strained-silicon comprises a channel region in a silicon-containing substrate, source/drain regions adjacent to two ends of the channel region, a gate dielectric layer on the channel region and a gate on the gate dielectric layer. The region beneath the channel region is converted to a strain inducing layer after ion implantation and high temperature processing. Compressive strained-silicon is thereby formed in the channel region.

Another embodiment of a MOSFET fabricated by a fabrication method for compressive strained-silicon comprises a channel region in a silicon-containing substrate, source/drain regions adjacent to two ends of the channel region, a gate dielectric layer on the channel region and a gate on the gate dielectric layer. The regions beneath the source/drain regions are converted to a strain inducing layer after ion implantation and high temperature processing. Compressive strained-silicon is thereby formed in the source/drain regions and tensile strain induced in the channel region.

Embodiments of fabrication methods of compressive strained-silicon and devices fabricated thereby make use of ion implantation and high temperature processing to induce compressive strain in the vicinity of the region containing the implanted ions, such that hole mobility is increased. Furthermore, the compressive strain in the vicinity of the region containing the implanted ions can induce tensile strain in the region thereof.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION

In embodiments of fabrication methods for compressive strained-silicon and devices fabricated thereby, while hydrogen is used as an example of an ion used in implantation. Other ions that can induce compressive strain after high temperature processing are also applicable to the disclosed embodiments.

Figure 1A:
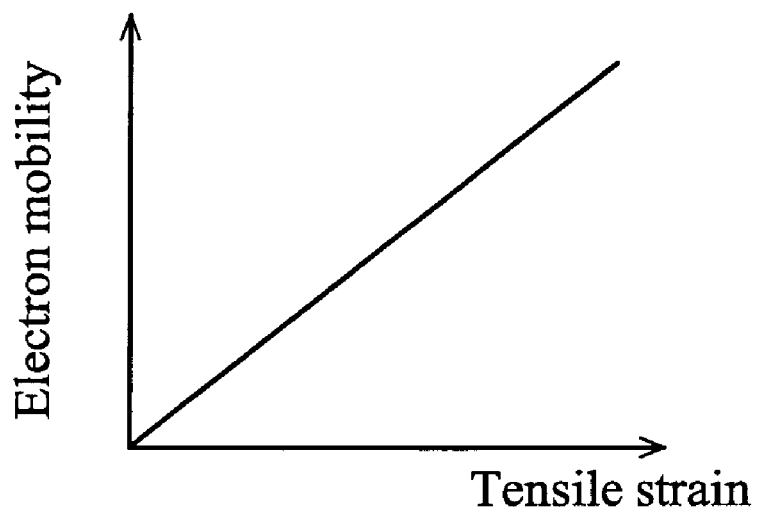
FIG. 1A shows electron mobility of an NMOS transistor corresponding to tensile strain thereof.
Figure 1B:
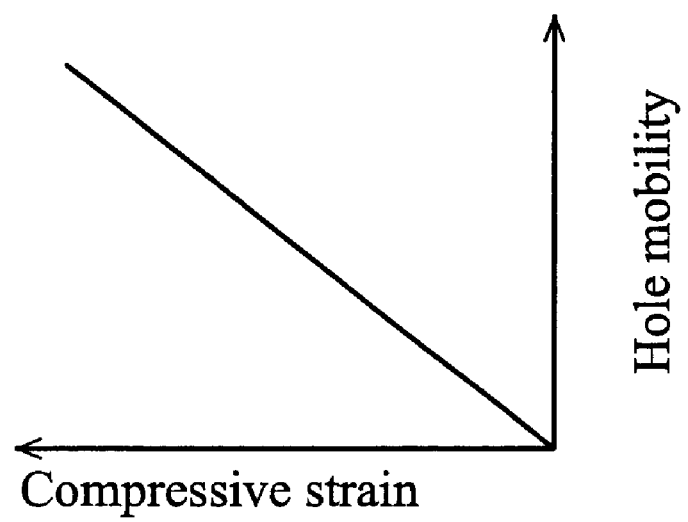
FIG. 1B shows hole mobility of a PMOS transistor corresponding to compressive strain thereof.
Figure 2A:
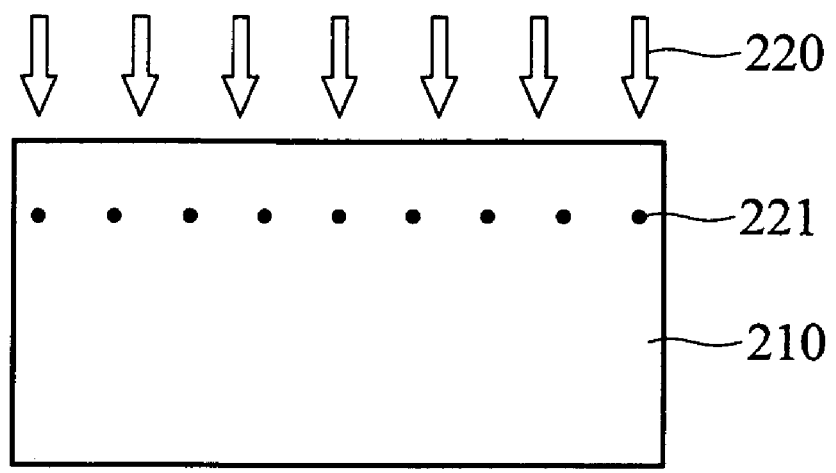
FIGS. 2A and 2B show an embodiment of fabrication methods for compressive strained-silicon using hydrogen ion implantation.
Figure 2B:
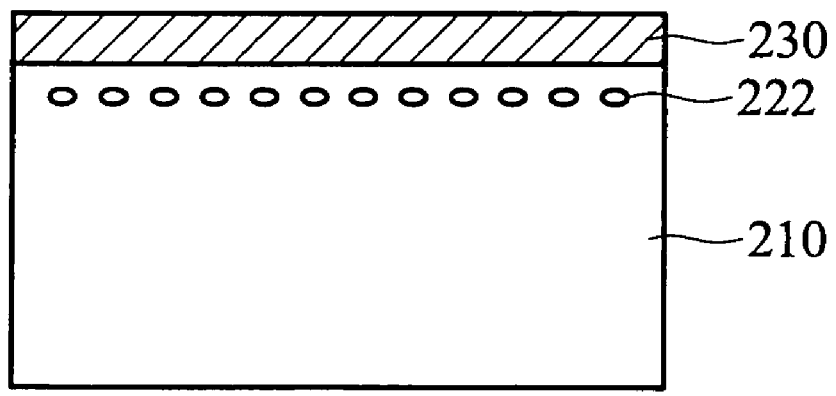

FIGS. 2A and 2B illustrate an embodiment of fabrication methods for compressive strained-silicon using hydrogen ion implantation. As shown in FIG. 2A, a silicon-containing substrate 210 is provided. The silicon-containing substrate 210 can be a single crystal, polycrystalline, amorphous silicon, SiGe, or silicon on insulator (SOI) substrate, and can, be attached or bonded to other substrate or film. Hydrogen ions 220 are implanted into the silicon-containing substrate 210, preferably in the range of 1E14 $cm^{-2}$ to 1E17 $cm^{-2}$. The implant energy can be designed to create an implant layer 221 in the silicon-containing substrate 210. As shown in FIG. 2B, voids are formed in the layer containing implanted hydrogen ions after high temperature processing. A strain inducing layer 222 is formed and induces compressive strain in the vicinity. Compressive strained-silicon is thereby formed at the surface of the silicon-containing substrate 210 and used as a carrier channel 230. High temperature processing can use furnace annealing, rapid thermal annealing (RTA) or the like, between 25° C. and 1200° C. for a duration of several seconds to hours.

Figure 3A:
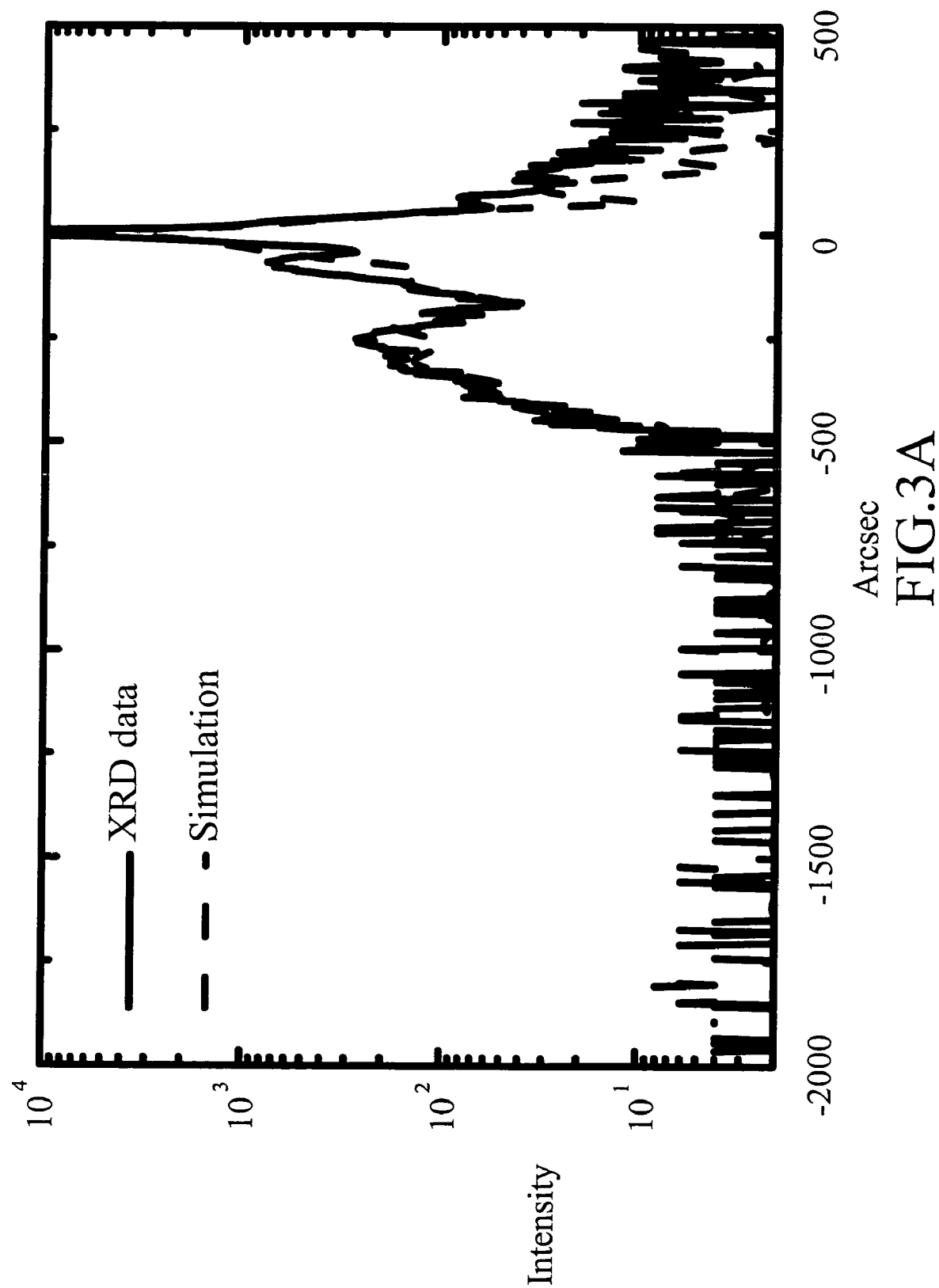
FIGS. 3A and 3B are diagrams of X-ray diffraction (XRD) of the silicon-containing substrate after hydrogen ion implantation and high temperature processing.
Figure 3B:
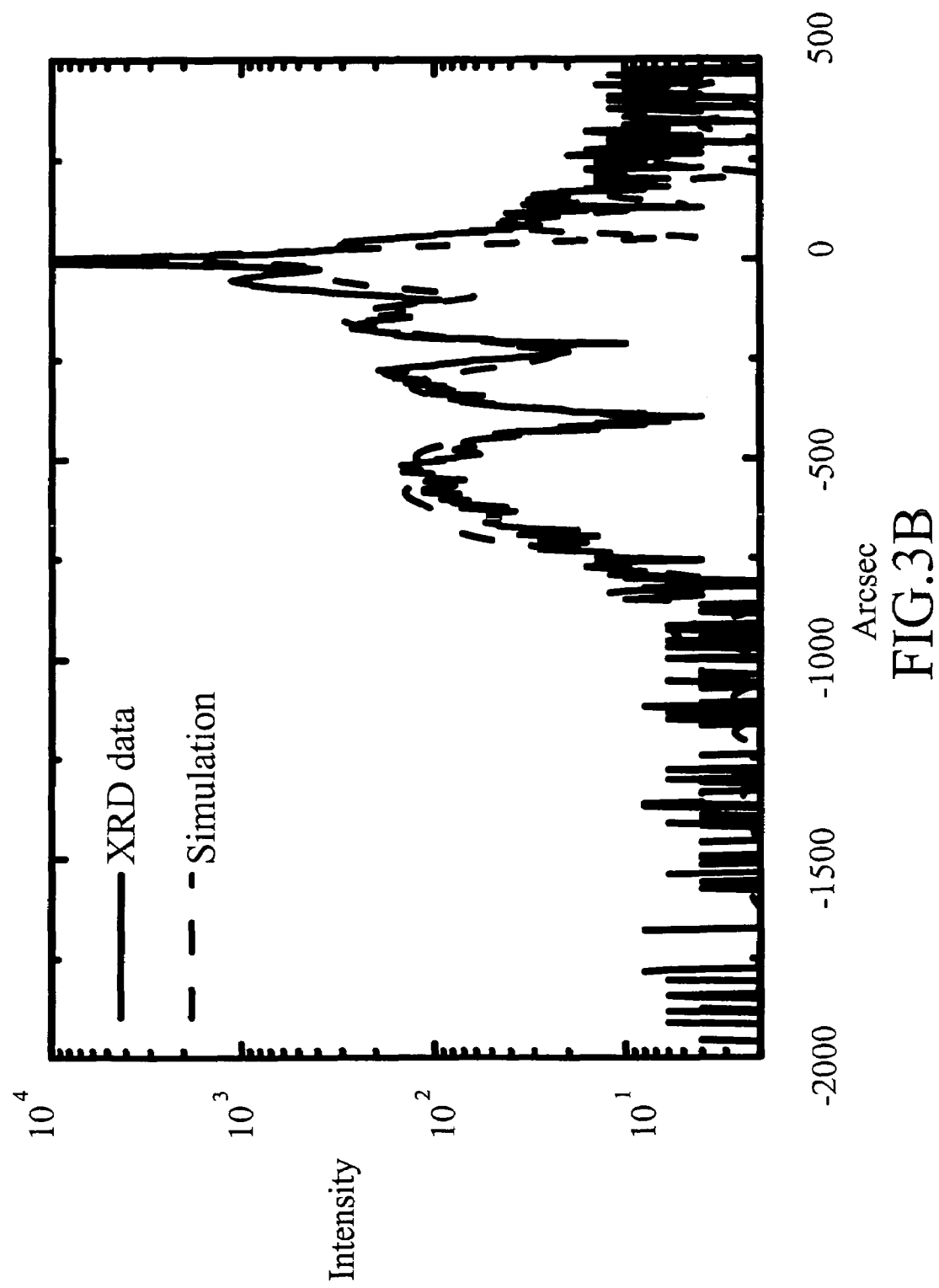

FIGS. 3A and 3B are diagrams of X-ray diffraction (XRD) of the silicon-containing substrate after hydrogen ion implantation and high temperature processing. The implant energy is 40 KeV for both FIGS. 3A and 3B when the dosage is $1E16$ $cm^{-2}$ and $2E16$ $cm^{-2}$, for FIGS. 3A and 3B respectively. XRD is often used in analysis of lattice constant. In XRD analysis, the peak of the unstrained-silicon is the baseline. Tensile strain results in another peak on the positive (right) side of the peak of the unstrained-silicon. Compressive strain results in another peak on the negative (left) side of the peak of the unstrained-silicon. As shown in FIGS. 3A and 3B, the peak of the silicon after hydrogen ion implantation and high temperature processing shifts toward the left side. Thus hydrogen ion implantation and high temperature processing result in compressive strained-silicon. The compressive strain increases with the dosage of the implanted hydrogen ion, rendering the lattice constant adjustable. Accordingly, hydrogen dosage can be adjusted to improve electron mobility. It is noted that the dosage must be carefully controlled. If silicon is under-doped with hydrogen, the compressive strain is insufficient and electron mobility not improved significantly. If silicon, however, is over-doped, voids can contact one another after high temperature processing, resulting in surface peeling of the silicon-containing substrate. Thus, dosage of hydrogen is controlled between $1E14$ $cm^{-2}$ and $1E17$ $cm^{-2}$. The required time for high temperature processing increases with decreasing hydrogen dosage. The depth of hydrogen implantation is controlled by adjusting the implant energy, with depth increasing 8 nm with every energy increase of 1 keV.

Figure 4A:
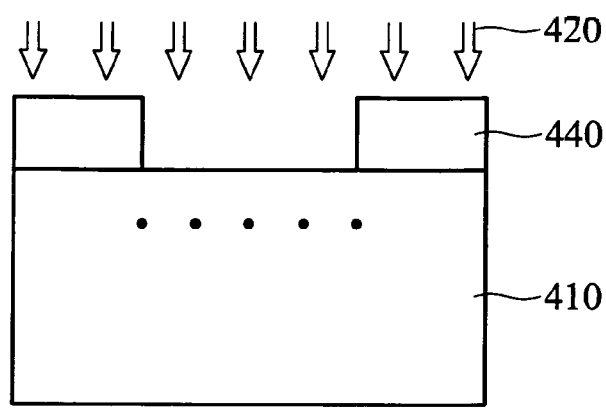
FIGS. 4A~4C show another embodiment of fabrication methods of compressive strained-silicon using hydrogen ion implantation.
Figure 4B:
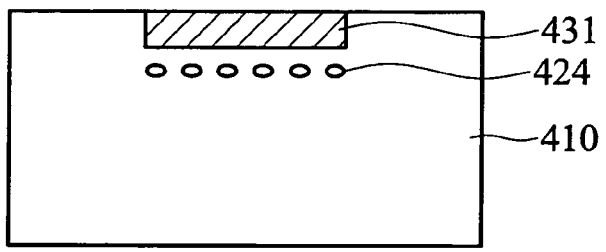
Figure 4C:
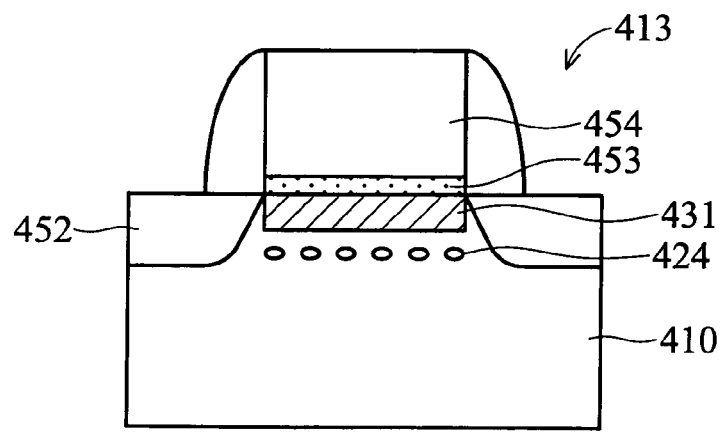

FIGS. 4A~4C illustrate another embodiment of fabrication methods of compressive strained-silicon using hydrogen ion implantation. As shown in FIG. 4A, an implant-blocking layer 440 is formed on the silicon-containing substrate 410 outside channel regions. Thereafter, hydrogen ions 420 are implanted into the silicon-containing substrate 410. Subsequently, hydrogen ion implantation and high temperature processing, as shown in FIG. 4B, are performed and the implant-blocking layer 440 is removed. A strain inducing layer 424 is formed in the silicon-containing substrate 410 and a channel region 431 with compressive strain results. As shown in FIG. 4C, a conventional standard logic process can be used to form a P-MOSFET 413 with a compressively strained channel. It is noted that an N-MOSFET located between two P-MOSFETs 413 with compressively strained channels 413 is affected by the compressive strain therein and undergoes tensile strain, improving electron mobility thereof.

Figure 5A:
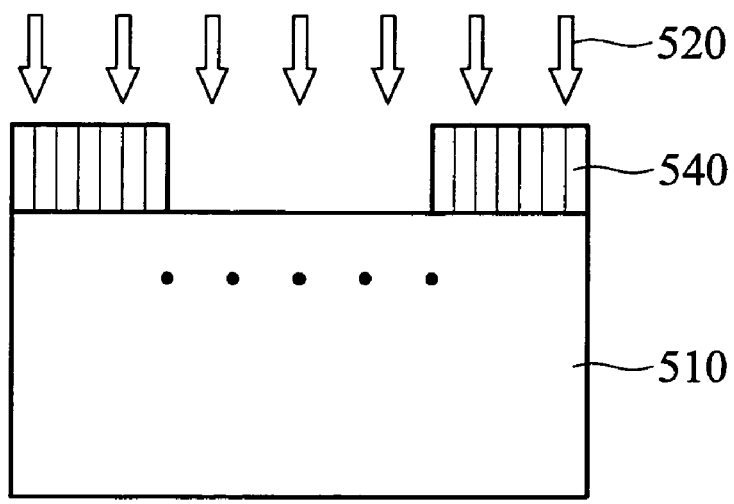
FIGS. 5A~5D show another embodiment of fabrication methods of compressive strained-silicon using hydrogen ion implantation.
Figure 5B:
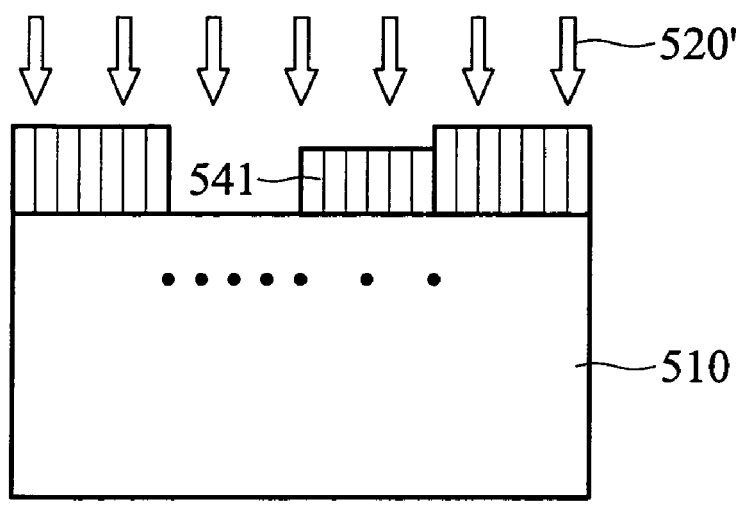
Figure 5C:
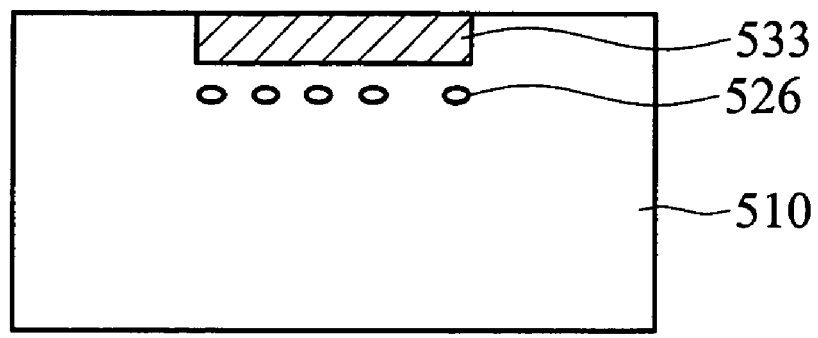
Figure 5D:
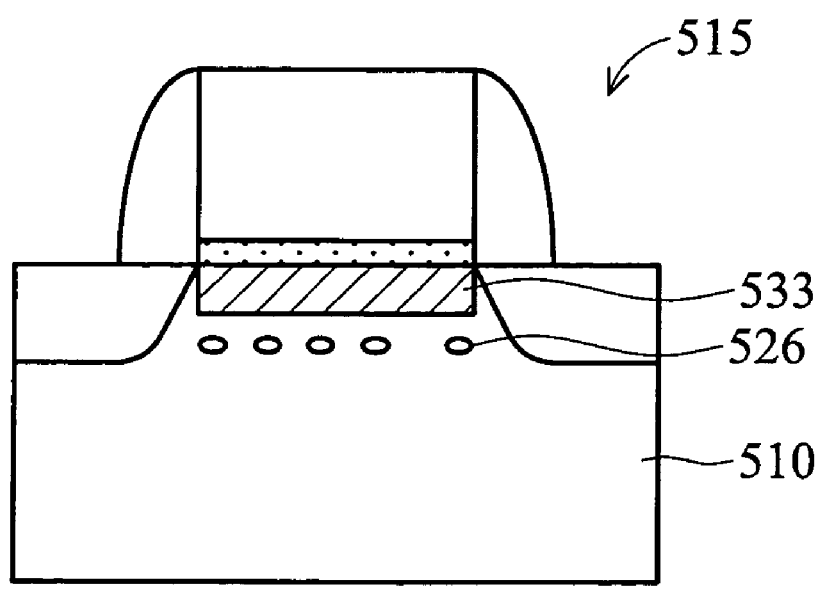

FIGS. 5A~5D illustrate yet another embodiment of fabrication methods, of compressive strained-silicon using hydrogen ion implantation. As shown in FIG. 5A, a first implant-blocking layer 540 is formed on the silicon-containing substrate 510 outside channel regions. Subsequently, a first hydrogen ion implantation 520 is performed. Since there are more carriers in the channel near the source region of a transistor, performance of the transistor is better if there is higher strain near the source region of the transistor. As shown in FIG. 5B, a second implant-blocking layer 541 is formed to define a region near the source region of the transistor and a second hydrogen ion implantation 520' is performed. Thereafter, as shown in FIG. 5C, high temperature processing forms an asymmetrical compressive strain inducing layer 526 and asymmetrical compressively strained channel 533. A P-MOSFET 515 with asymmetrical compressively strained channel is formed. Additionally, an N-MOSFET located between two P-MOSFETs 413 with compressively strained channels 515 is affected by the compressive strain therein and undergoes tensile strain, improving electron mobility thereof.

Figure 6A:
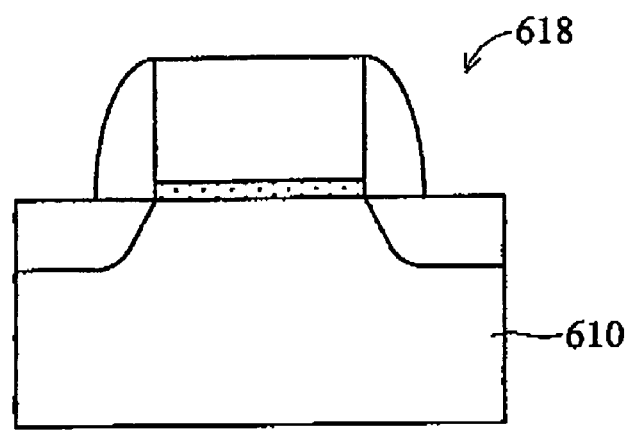
FIGS. 6A~6C show another embodiment of fabrication methods of compressive strained-silicon using hydrogen ion implantation.
Figure 6B:
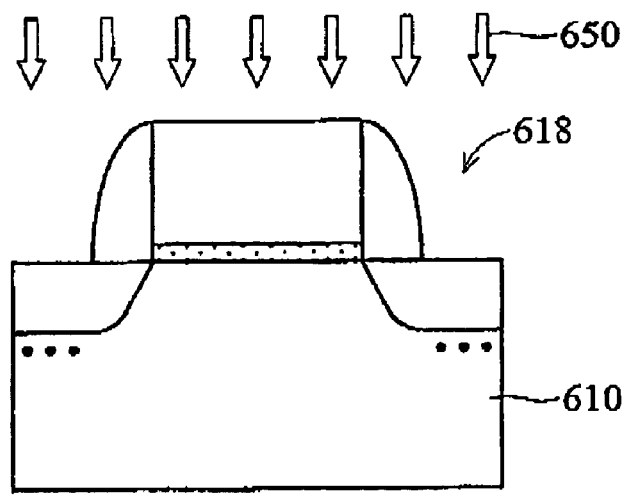
Figure 6C:
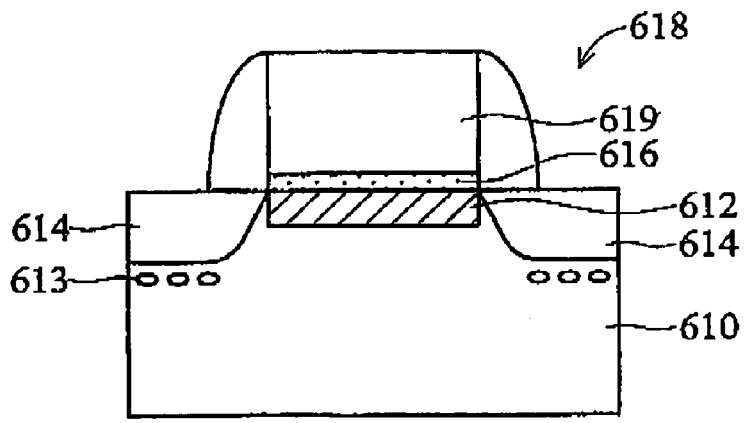

FIGS. 6A~6C illustrate still another embodiment of fabrication methods of compressive strained-silicon using hydrogen ion implantation. As shown in FIG. 6A, a transistor 618 is first formed. Thereafter, hydrogen ion implantation 650, as shown in FIG. 6B, is performed. Subsequently, as shown in FIG. 6C, after high temperature processing, the N-type MOSFET 618 comprises a channel region 612 in a silicon-containing substrate 610, source/drain regions 614 adjacent to two ends of the channel region 612, a gate dielectric layer 616 on the channel region 612 and a gate 619 on the gate dielectric layer 616. The regions beneath the source/drain regions 614 are converted to strain inducing layers 613 after ion implantation and high temperature processing. Compressive strained-silicon is thereby formed in the source/drain regions 614 and tensile strain is thereby induced in the channel region 612.

While the invention has been described by way of example and in terms of several embodiments, it is to be understood that the invention is not limited thereto. To the contrary, it is intended to cover various modifications and (as would be apparent to those skilled in the art). Therefore, the scope of the appended claims should be accorded the broadest interpretation so as to encompass all such modifications.

What is claimed is:

1. A fabrication method of compressive strained-silicon by ion implantation, comprising:
   providing a silicon-containing substrate having a source region, a drain region, and a channel region, wherein the channel region is disposed between the source region and the drain region;
   forming at least one of an N-MOSFET or a P-MOSFET in the substrate;
   implanting hydrogen ions into at least one of the source and drain regions of the N-MOSFET, or the channel region of the P-MOSFET; and
   performing high temperature processing to create voids in the region containing the ions, thereby converting the region containing the ions to a strain inducing layer and inducing compressive strain in the vicinity of the strain inducing layer.

2. The method as claimed in claim 1, wherein the dosage of implantation is between $1E14$ $cm^{-2}$ and $1E17$ $cm^{-2}$.

3. The method as claimed in claim 1, wherein implant depth is between 3 nm 10 μm.

4. The method as claimed in claim 1, wherein the silicon-containing substrate is a single crystal, polycrystalline, amorphous silicon, SiGe, or silicon on insulator (SOI) substrate.

5. The method as claimed in claim 1, wherein the silicon-containing substrate is attached or bonded to another substrate or film.

6. The method as claimed in claim 1, wherein an implant-blocking layer is formed during implantation, to confine the implanted ions to a specific region.

7. The method as claimed in claim 1, further comprising an additional ion implantation step sufficient to form an asymmetrical compressive strained channel.

8. The method as claimed in claim 1, wherein implantation is performed before, during, or after the formation of a transistor.

9. The method as claimed in claim 1, wherein the high temperature processing is performed at between 25° C. and 1200° C.

10. The method as claimed in claim 1, wherein the high temperature processing lasts from several seconds to hours.

11. A fabrication method of compressive strained-silicon by ion implantation, comprising:
providing a silicon-containing substrate;
performing a first implant of ions into the silicon-containing substrate;
performing a second implant of ions into the silicon-containing substrate; and
performing high temperature processing to create voids in the region containing the ions, thereby converting the region containing the ions to an asymmetrical strain inducing layer and inducing compressive strain in the vicinity of the strain inducing layer.

12. The method as claimed in claim 11, wherein the ions implanted into the silicon-containing substrate are hydrogen.

13. The method as claimed in claim 11, wherein the dosage of implantation is between 1E14 $cm^{-2}$ and 1E17 $cm^{-2}$.

14. The method as claimed in claim 11, wherein implant depth is between 3 nm and 10 μm.

15. The method as claimed in claim 11, wherein the silicon-containing substrate is a single crystal, polycrystalline, amorphous silicon, SiGe, or silicon on insulator (SOI) substrate.

16. The method as claimed in claim 11, wherein the silicon-containing substrate is attached or bonded to other substrate or film.

17. The method as claimed in claim 11, wherein, during at least one of the first and second implant of ions, an implant-blocking layer is formed to confine the implanted ions to a specific region.

18. The method as claimed in claim 11, wherein implantation is performed before, during, or after the formation of a transistor.

19. The method as claimed in claim 11, wherein the high temperature processing is performed at between 25° C. and 1200° C.

20. The method as claimed in claim 11, wherein the high temperature processing lasts from several seconds to hours.

* * * * *